(12) United States Patent
Ling et al.

(10) Patent No.: US 6,923,930 B2
(45) Date of Patent: Aug. 2, 2005

(54) MOLD FOR NANO IMPRINTING

(75) Inventors: Torbjörn Ling, Lund (SE); Lars Montelius, Bjärred (SE); Babak Heidari, Furulund (SE)

(73) Assignee: Obducat Aktiebolag, Malmo (SE)

( * ) Notice: Subject to any disclaimer, the term of this patent is extended or adjusted under 35 U.S.C. 154(b) by 177 days.

(21) Appl. No.: 10/181,487

(22) PCT Filed: Jan. 19, 2001

(86) PCT No.: PCT/SE01/00087

§ 371 (c)(1),
(2), (4) Date: Oct. 7, 2002

(87) PCT Pub. No.: WO01/53889

PCT Pub. Date: Jul. 26, 2001

(65) Prior Publication Data

US 2003/0127580 A1 Jul. 10, 2003

Related U.S. Application Data

(60) Provisional application No. 60/177,284, filed on Jan. 21, 2000.

(30) Foreign Application Priority Data

Jan. 21, 2000 (SE) .............................. 0000173

(51) Int. Cl.[7] .............................. B29C 33/66; B81C 1/00
(52) U.S. Cl. ...................... 264/293; 264/337; 249/115; 249/135; 101/28; 101/483; 106/38.22
(58) Field of Search ............................. 249/114.1, 115, 249/135; 264/293, 337, 338; 101/16, 17, 28, 483; 106/38.2, 38.22; 148/271, 283; 427/135

(56) References Cited

U.S. PATENT DOCUMENTS

| 4,584,156 A | * | 4/1986 | Ponjee ....................... 264/263 |
| 5,259,926 A | | 11/1993 | Kuwabara et al. |
| 5,358,604 A | | 10/1994 | Lin et al. |
| 5,512,131 A | | 4/1996 | Kumar et al. |
| 5,772,905 A | | 6/1998 | Chou |
| 6,656,398 B2 | * | 12/2003 | Birch et al. .................... 264/85 |
| 6,743,368 B2 | * | 6/2004 | Lee ............................... 216/2 |
| 6,829,988 B2 | * | 12/2004 | George et al. ................. 101/17 |

FOREIGN PATENT DOCUMENTS

| DE | 198 15 130 | 10/1999 |
| WO | WO00/00868 | 1/2000 |

OTHER PUBLICATIONS

R.W. Jaszewski et al., Properties of Thin Anti–Adhesive Films Used for the Replication of Microstructures in Polymers, Microelectronic Engineering, vol. 35, pp. 381–384, (1997).

* cited by examiner

Primary Examiner—Donald Heckenberg
(74) Attorney, Agent, or Firm—Finnegan, Henderson, Farabow, Garrett & Dunner, LLP

(57) ABSTRACT

A metal mold for use in a nano-imprinting process comprises a firmly adhering monomolecular non-sticking layer. The layer was obtained by subjecting the mold to a reaction with a fluoroalkyl compound having a mercapto group. As a result of said reaction, the layer comprises an organic sulfide of said metal.

18 Claims, No Drawings

MOLD FOR NANO IMPRINTING

This application is a National Phase application of international application number PCT/SE01/00087, filed Jan. 19, 2001, which claims priority to Swedish Patent Application No. 0000173-6, filed Jan. 21, 2000, and claims the benefit of U.S. provisional application No. 60/177,284, filed Jan. 21, 2000, the contents of both of which are incorporated herein by reference.

TECHNICAL FIELD OF THE INVENTION

The present invention relates to nano-imprinting in general and especially to a mold for nano-imprinting.

BACKGROUND ART

In the replication of nanostructures by hot embossing it is necessary to provide a non-sticking interface between the nanostructured master and the thermoplastic to be embossed. This allows demolding without degrading the replication fidelity. Adhesion during the mold release can cause damage to the replica. Further, residual polymer structures can contaminate the surface of the mold. A prerequisite for a successful imprint process is that the mold used should be chemically and mechanically stable and also adhere poorly with polymers to avoid sticking thereof to the mold.

R. W. Jaszewski, et al disclose in Microelectronic Engineering 35 (1997) 381–384 covering the surface of the mold with an ultra-thin anti-adhesive layer comprising a polytetrafluoroethylene (PTFE) film. The film is deposited according to two kinds of techniques, i.e. plasma polymerization and ion sputtering from a plasma. Jaszewski et al allege in the above article that the quality of the film is degraded during the embossing process. Thus, it seems that the anti-adhesive layer according to Jaszewski et al is not sufficiently stable.

SUMMARY OF THE INVENTION

It is a main object of the invention to provide a metal mold having improved anti-adhesive properties. This object is accomplished with a metal mold for use in a nano-imprinting process, said mold comprising a firmly adhering monomolecular non-sticking layer, said layer being obtained by subjecting the mold to a reaction with a fluoroalkyl compound having a mercapto group, said layer, as a result of said reaction, comprising a sulfide of said metal.

Other advantages and characteristics of the invention will be described below in more detail.

DETAILED DESCRIPTION OF THE INVENTION

Before explaining the invention in greater detail a discussion will be presented concerning the imprint processes, to which the mold is applied. A non-limiting example is nano-imprint lithography, which is a technique for mass production of nano structures. This includes two basic parts. The first part is a mold, which defines the nano structure on its surface, and the second part is pattern transfer from the mold into a polymer on various substrates. As to nano-imprint lithography reference is made to U.S. Pat. No. 5,772,905 to Chou and U.S. Pat. No. 5,259,926 to Kuwabara et al. These patents are entirely incorporated herein by reference. The mold according to the invention can be used in other imprint processes as well.

In the present description "metal mold" refers to any mold for nano-imprinting that has a metal surface which is intended to contact the surface of a substrate to be embossed.

The term "nano-imprinting" should not be read as referring only to submicron structures, i.e. structures with a size in the range of 1–1000 nm. A mold often includes both submicron structures and structures with a size of up to 100 micron, and larger. The present invention is applicable for molds comprising submicron structures and/or micron structures. The best effect of the invention is observed with the submicron structures since these are relatively more sensitive to adhesion during mold release.

The present invention is based on the finding that a very firmly adhering monomolecular non-sticking layer can be obtained on the mold by subjecting the latter to a reaction with a fluoroalkyl compound having a mercapto group. This compound includes two principal groups, R and X. The first group, called R, has non-sticking properties. The second group, X, which is bound to the R-group, binds the compound, denoted RX, to the mold surface to form a monomolecular non-sticking layer.

According to one aspect of the invention, the mold is made of metal, such as nickel, chromium, etc and thus the non-sticking layer is formed by reaction with a fluoroalkyl compound having a mercapto group. The result of the reaction is a very strong layer comprising an organic sulfide of nickel in case of a nickel mold.

The R-group may include two subgroups; a first subgroup, called RA, that includes the non-sticking functionality, and a second subgroup, called RS, which serves as a "spacer".

The first subgroup, RA, is a fluoroalkyl-containing group. The simplified representation of the RA-group is $C_nF_mY_p$. C is carbon. The number of carbon atoms in RA is preferably n=1–20, more preferred n=1–10. F is fluorine. The number of fluorine atoms in RA is preferably m=1–30, more preferred m=3–20. Y may be hydrogen, oxygen, nitrogen, silicon or other atoms. In order to avoid any unwanted reactions with the surface of the mold Y is preferably hydrogen. The number of Y-atoms, p, is the number required to balance the RA-group with respect to its charge.

Each carbon atom in the RA-subgroup may be bound to 1–3 fluorine atoms. Preferably RA includes at least one perfluorinated carbon atom. Preferably the perfluorinated carbon atom is the terminal end carbon atom of the main chain of the RA-subgroup. RA may be linear or branched. For the non-sticking properties it is advantageous to have as many and as closely packed molecules of the RX-compound as possible bound to the surface of the mold. For reasons of close packing of the RX molecules the RA subgroup is preferably a linear chain, such as for example

[linear chain, no branches]
or a main chain with 1–3 short branches, such as for example

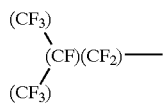

[main chain with one branch]
The branches, if any, preferably have a length of 1–3 carbon atoms each.

The surface of the metal mold for nano-imprinting has a certain nano structure. This structure could be described as for example ridges, mountains and valleys in a nano scale. For some structures it may be difficult to obtain a sufficiently dense concentration of non-sticking functionality at the peaks of the mountains and at the corners of the ridges using a monomolecular layer of linear molecules. Thus the terminal end of the RA main chain is preferably branched to make the "head" of the RX-compound larger to improve the density of the non-sticking functionality and thus the non-sticking properties at the peaks, edges and corners of the nano structured surface. Preferably the branches as well as the main chain each include a perfluorinated carbon atom. Examples of such RA-subgroups with an enlarged head with non-sticking properties include:

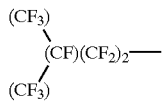

[main chain with one branch]

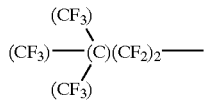

[main chain with two branches]

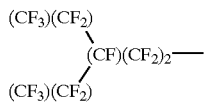

[main chain with one longer branch]

Another possibility, which is sometimes attractive for solving the above-mentioned difficulty, is to use very short main chains, for example R-groups with a total length of 2–3 carbon atoms, with no or short branches.

The non-sticking subgroup RA of the R-group should be situated at some distance from the mold surface to obtain the maximum non-sticking effect. The distance, represented as the number of carbon atoms being in line, from the X-group to the final and most distant carbon atom of the RA-subgroup is preferably 1–20 carbon atoms. Thus the total length of the main chain of the R-group is preferably 2–21 carbon atoms. If the RA-subgroup itself is not long enough a spacer subgroup RS may be used. The spacer subgroup RS is a hydrocarbon with the general formula $C_qY_z$. C is carbon and q is the number of carbon atoms. For linear RS-groups q is preferably 1–19. For branched RS-groups q is preferably 2–30. As discussed above the total distance from the X-group to the final carbon atom of the RA-subgroup is 1–20 carbon atoms. For a given RA-subgroup this condition results in a range for q. If the RA-subgroup itself has a sufficiently long carbon chain, then the RS-subgroup may be omitted. Y may be hydrogen, oxygen, nitrogen, silicon or other atoms. For reasons discussed above Y is preferably hydrogen.

The fluorine atoms of the RA-subgroup may influence the bond between the mercapto group and the metal. To avoid this it is preferable to use an RS-subgroup containing at least one hydrocarbon unit with the structure:

The unit —(CH$_2$)— "isolates" the fluorine atoms of the RA-subgroup from the bond. Preferably an alkyl-group with at least 2–3 units of this type should be used for best "isolation" of the RA-subgroup from the mercapto-group.

The shortest RS-subgroup is thus preferably:

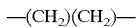

For reasons of close packing of the RX-compound the RS-subgroup is preferably a linear group, such as for example

[linear chain, no branches]
or a group with short branches such as for example

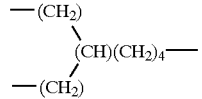

[main chain with one branch]
or

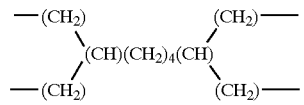

[main chain with one branch at each end]

The branches, if any, preferably have a length of 1–3 carbon atoms each. Preferably the RS-subgroup is an alkyl-group. In the case of a branched RS-subgroup several RA-subgroups and/or several mercapto groups may be attached to the RS-subgroup. RA- and RS-subgroups containing double or triple bonds are possible but less preferred since they may participate in unwanted addition reactions during heating of the mold.

The mold used in the nano-imprint process is a metal mold. The metal mold may be of two different types. The first type is a mold made from solid metal. The nano structure is formed directly on the metal surface by e.g. an etching process known in the art. The second type is a mold comprising a base, e.g. made from silicon. The base may be solid or made from several layers, and may be provided with a surface layer or film that is made from a metal. A preferred embodiment of this second type of mold is to first form the nano structure on a silicon surface, by e.g. etching processes known in the art. Then a very thin layer of metal is applied on top of the silicon surface using e.g. thermic evaporation or electrochemical precipitation. The thickness of the metal layer depends on the nano structure and the required wear resistance of the mold. In this way a mold is obtained having a metal surface that has a well defined nano structure and good wear properties.

Several different metals, such as nickel, chromium, titanium, platinum, copper, silver, and gold, may be used for the mold. The preferred metals are nickel, Ni, and chromium, Cr, due to their corrosion resistance, moderate price and high hardness. An important aspect is that the non-sticking layer on the metal mold should have very uniform properties. The binding process and the binding energy of the monomolecular non-sticking layer will be different for different metals. The metal surface is thus preferably a rather pure metal, such as unalloyed nickel or unalloyed chromium. Alloys, such as stainless steel, and mixtures, such as a mixture of e.g. chromium and nickel, are less preferred, since the properties of the monomolecular non-sticking layer bound to an alloy or a mixture will vary over the surface.

The X-group binds the RX-compound to the surface of the metal mold. The X-group includes at least one mercapto group. One such mercapto group is the SH unit, wherein S denotes sulfur and H denotes hydrogen. The sulfur atom is bound directly to one of the carbon atoms of the R-group. If an RS-subgroup is included, then the sulfur of the SH unit is bound to one of the carbon atoms in that subgroup. If no RS-subgroup is present then the sulfur is bound to one of the carbon atoms in the RA-subgroup. The X-group may contain more than one SH unit, for example 2–4 SH units. In that case each SH-unit is bound to one carbon atom. The RS-subgroup bound to a X-group may, for example, have the following structure:

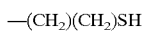

[RS-subgroup with X-group being one SH-unit]
or

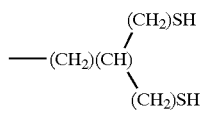

[branched RS-subgroup with X-group being two SH units]

The SH units may, if they have a number of 2–4 in each molecule of the RX-compound, form internal sulfur bridges, that is an S—S unit, such as for example:

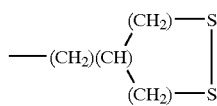

[branched RS-subgroup with X-group being a S—S unit]

The S—S unit is also included under the definition mercapto group, since the S—S unit reacts with metal surfaces in exactly the same way as the SH units and is basically just another state of SH units.

The mercapto groups react readily with the metals to form metal sulfides, such as nickel sulfide or chromium sulfide. An RX-compound, where X includes two or more SH units or at least one S—S unit, provides a stronger attachment of the RX-compound to the surface. This is preferred in cases where each metal sulfide bond is weak or when an extra strong attachment is required. An example of such an attachment, using a molecule with two SH units or a molecule with a sulfur bridge, that is an S—S unit, is shown below:

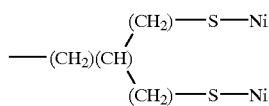

[branched RS-subgroup with X-group being two SH units or one S—S unit after attachment to a nickel surface]

For extremely small nano structures very small RX-compounds may be preferable. The main chain of the R-group may then be as short as 2–3 carbon atoms. Examples of such RX-compounds, with R-groups having in total only 2–5 carbon atoms include:

[linear R-group having two carbon atoms]
and

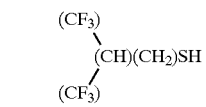

[R-group with main chain having one branch]

The conditions during the reaction between the metal surface and the RX-compound are such that the compound is in a gaseous phase or in a liquid phase while the mold is in a solid phase.

For reactions with the RX-compound in a gaseous phase it is preferred to clean the mold and place it in a vacuum oven under low pressure (about 10–200 mbar, preferably about 50–100 mbar) and at a temperature of about 50–200° C., preferably about 70–120° C. The fluoroalkyl compound having a mercapto group (the RX-compound) is then introduced into the oven. The mercapto group reacts with the metal surface forming a metal sulfide. When the reaction is completed the mold is withdrawn from the oven, cleaned, allowed to cool down and is then ready for use.

For reactions with the RX-compound in a liquid phase the mold is preferably cleaned in a solvent being adapted to the RX-compound. Examples of such a solvent include alkanes like pentane, hexane, heptane, octane etc. A solution is prepared by dissolving the RX-compound in a solvent, preferably the same solvent as was used for cleaning the mold. The concentration of the RX-compound in the solution is not critical, but often 1–10% is convenient. The temperature of the solution is not critical, but for practical reasons room temperature is often convenient. The cleaned mold is then dipped into an agitated container containing the solution. The mercapto group reacts with the metal surface forming a metal sulfide. The mold is then removed from the container and is cleaned by dipping it into one or several consecutive baths each preferably containing the same solvent as was used for the solution. The mold is finally dried, either by heating it sufficiently to evaporate the solvent or by flushing it with nitrogen gas.

The choice of RX-compounds of the formula above is not critical according to the invention and one skilled in the art can easily, without extensive experimentation, find the most appropriate one in each case. By this choice possibility the layer can be tailored in view of factors material to the actual use of the mold, which is a great advantage.

BEST MODE OF PERFORMING THE INVENTION

An embodiment of the invention, which at present is judged to be the best mode of performing the invention, will be described below with reference to a working example.

EXAMPLE 1

A silicon mold was etched to define a certain nano structure. The surface of the mold was then coated with a thin layer of nickel. The mold was cleaned in heptane.

A fluoroalkyl compound having a mercapto group, which compound was 1H, 1H, 2H, 2H-perfluorooctanethiol and had the structure:

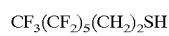

was dissolved in heptane to obtain a 2% solution. The temperature of the solution was about 20° C. The cleaned metal mold was put into an agitated beaker containing the solution. The mold was now provided with a mono-molecular non-sticking layer with the structure:

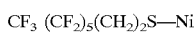

The mold was taken up from the beaker and was cleaned by dipping it in each of three consecutive beakers each containing heptane. The mold was then heated to 70° C. whereby the heptane was evaporated. The mold was tested in a nano-imprint lithography process and it was found that the mold withstood more than 50 imprint sequences without any detectable degradation.

The example above was repeated, except that the following fluoroalkyl compounds having a mercapto group were used:

TABLE 1

Additionally tested compounds

| R-group | | | |
|---|---|---|---|
| RA-subgroup | RS-subgroup | X-group | Metal |
| $(CF_3)$— | $-(CH_2)_2$— | —SH | Ni |
| $(CF_3)_2(CF)$— | $-(CH_2)(CH)((CH_2)-)_2$ | —S—S— | Cr |
| $(CF_3)(CF_2)_3$— | $-(CH_2)_2$— | —SH | Ni |
| $(CF_3)(CF_2)_7$— | $-(CH_2)_2$— | —SH | Cr |

Similar results were obtained upon testing.

EXAMPLE 2

The same RX-compound as described in example 1 was applied to a mold similar to that used in example 1. The mold was cleaned in heptane and then put into an oven that had a temperature of 110° C., a nitrogen atmosphere and a pressure of 75 mbar. Pure RX-compound was injected into the oven. The mold, now provided with a mono-molecular non-sticking layer with a structure similar to that described in example 1, was taken out of the oven and was cleaned by dipping it in each of three consecutive beakers each containing heptane. Finally, the mold was dried by heating it to 70° C. Similar results as in example 1 were obtained upon testing.

What is claimed is:

1. A metal mold comprising at least one monomolecular non-sticking layer, said layer obtained by reacting the metal mold with at least one fluoroalkyl compound comprising at least one mercapto group, and said layer comprising at least one sulfide of the metal mold as a result of said reaction.

2. The metal mold of claim 1, wherein the metal mold is chosen from a mold of solid metal and a mold with a metal surface.

3. The metal mold of claim 2, wherein the metal mold comprises a layer of metal applied on a base material.

4. The metal mold of claim 1, wherein the metal mold is nickel or chromium.

5. The metal mold of claim 2, wherein the metal surface is nickel or chromium.

6. The metal mold of claim 1, wherein the metal mold is unalloyed.

7. The metal mold of claim 2, wherein the metal surface is unalloyed.

8. The metal mold of claim 1, wherein the fluoroalkyl compound comprising at least one mecapto group is denoted RX, wherein R is a group with non-sticking properties, and X comprises at least one mercapto group, wherein R is a linear fluoroalkyl group, which is branched or unbranched, and which has a first end comprising at least one fluorinated carbon atom and a second end bound to X.

9. The metal mold of claim 8, wherein at least one of the one fluorinated carbon atom is a perfluorinated carbon atom.

10. The metal mold of claim 8, wherein the first end of R comprises 1, 2 or 3 branches, each independently with a length of 1, 2, or 3 carbon atoms, and wherein each of the branches and the first end of R comprise at least one perfluorinated carbon atom.

11. The metal mold of claim 8, wherein the main chain of R has a total length of 2–3 carbon atoms.

12. The metal mold of claim 1, wherein immediately prior to said reaction the fluoroalkyl compound is in a gaseous phase.

13. The metal mold of claim 1, wherein during said reaction the fluoroalkyl compound is in a gaseous phase.

14. The metal mold of claim 1, wherein immediately prior to said reaction the fluoroalkyl compound is in a liquid phase or is dissolved in a solvent.

15. The metal mold of claim 1, wherein during said reaction the fluoroalkyl compound is in a liquid phase or is dissolved in a solvent.

16. The metal mold of claim 1, wherein the monomolecular non-sticking layer is firmly adhering.

17. A nano-imprinting process comprising the use of a metal mold, said metal mold comprising at least one monomolecular non-sticking layer, said layer obtained by reacting the metal mold with at least one fluoroalkyl compound comprising at least one mercapto group, and said layer comprising at least one sulfide of the metal mold as a result of said reaction.

18. The nano-imprinting process of claim 17, wherein said process is nano-imprint lithography.

* * * * *

UNITED STATES PATENT AND TRADEMARK OFFICE
CERTIFICATE OF CORRECTION

PATENT NO. : 6,923,930 B2
DATED : August 2, 2005
INVENTOR(S) : Torbjörn Ling et al.

It is certified that error appears in the above-identified patent and that said Letters Patent is hereby corrected as shown below:

Column 8,
Line 10, "mecapto" should read -- mercapto --.

Signed and Sealed this

Eleventh Day of October, 2005

JON W. DUDAS
*Director of the United States Patent and Trademark Office*